（12） United States Patent
Masuda et al.

(10) Patent No.: US 6,278,296 B1
(45) Date of Patent: Aug. 21, 2001

(54) DYNAMIC LOGIC CIRCUIT AND INTEGRATED CIRCUIT DEVICE USING THE LOGIC CIRCUIT

(75) Inventors: Noboru Masuda, Tokorozawa; Michitaka Yamamoto, Machida, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/369,199

(22) Filed: Aug. 6, 1999

(30) Foreign Application Priority Data

Aug. 7, 1998 (JP) ................................. 10-224004

(51) Int. Cl.$^7$ ............................................. H03K 19/096
(52) U.S. Cl. ............................. 326/95; 326/98; 326/112; 326/119
(58) Field of Search .................. 326/95, 98, 112, 326/121, 119, 122

(56) References Cited

U.S. PATENT DOCUMENTS

| 5,852,373 | * 12/1998 | Chu et al. ................................ 326/98 |
| 5,926,038 | * 7/1999 | Fouts et al. ............................. 326/95 |
| 5,936,449 | * 8/1999 | Huang ..................................... 326/95 |
| 5,999,019 | * 12/1999 | Zheng et al. ........................... 326/98 |
| 6,075,386 | * 6/2000 | Naffziger ................................ 326/98 |

FOREIGN PATENT DOCUMENTS

| 58-79338 | 5/1983 | (JP) . |
| 61-224623 | 10/1986 | (JP) . |
| 63-93223 | * 4/1988 | (JP) ........................................ 326/98 |

OTHER PUBLICATIONS

Fundamentals of Digital Systems Design ( Rhyne, NJ, 1973, pp. 70–71).*

* cited by examiner

Primary Examiner—Michael Tokar
Assistant Examiner—Steven S. Paik
(74) Attorney, Agent, or Firm—Mattingly, Stanger & Malur, P.C.

(57) ABSTRACT

In a dynamic logic circuit, a signal delay time between a low-to-high transition of an input signal and a low-to-high transition of an output signal is reduced, a through current is decreased and a time required for the precharge is reduced. In the dynamic logic circuit a P-channel type MOS transistor (PMOS) has its source electrode connected with a power supply on the side of a high voltage potential Vdd. Its gate electrode receives a clock signal Cs. A logic portion includes N-channel type MOS transistors (NMOS) connected between a drain electrode of the PMOS and a power supply on the side of a low voltage potential Vss. An NMOS is provided between an input signal connected with a NMOS closest to the Vss in the NMOSs and the Vss. A reverse signal of the clock signal Cs is connected with a gate electrode of the NMOS. An input signal is forced to change to a low level at the time of the precharge, thereby a through current is decreased and a time required for the precharge is reduced. Therefore, a signal delay time is reduced.

19 Claims, 9 Drawing Sheets

DYNAMIC LOGIC CIRCUIT AND INTEGRATED CIRCUIT DEVICE USING THE LOGIC CIRCUIT

BACKGROUND OF THE INVENTION

1. Field of the Invention

The present invention relates to a dynamic logic circuit mounted on a CMOS semiconductor integrated circuit chip and a circuit included the dynamic logic circuit. In particular, the invention relates to a dynamic logic circuit operating at a high speed and a circuit including the dynamic logic circuit.

2. Description of the Related Art

FIG. 3 shows a prior art circuit disclosed in FIG. 4 of Japanese Patent Application No. 61-224623. FIG. 4 shows another prior art circuit disclosed in FIG. 7 of Japanese Patent Application No. 61-224623. Although in Japanese Patent Application No. 61-224623, both of FIGS. 4 or 7 show an example circuit having five input signal lines, to simplify them, FIGS. 3 and 4 show prior art circuits each having three input signal lines.

In the prior art circuit of FIG. 4, when a clock signal 160 is at a low level, because a P-channel type MOS transistor 100 is conducted and a N-channel type MOS transistor 400 is cut off, an internal signal 171 becomes a high level and an output signal 170 becomes a low level despite the status of input signals 151 and 153. This status is called a precharged status. Thereafter, when the clock signal 160 becomes a high level, the P-channel type MOS transistor 100 is cut off and the N-channel type MOS transistor 400 conducts. At this moment, when at least one of the input signals 151 through 153 is at a low level, the internal signal 171 becomes a floating status and is held at a high level and the output signal 170 is held at a low level. Further, when all of input signals 151 through 153 become a high level, the internal signal 171 becomes a low level and the output signal 170 becomes a high level because N-channel type MOS transistors 101 and 103 conduct. Accordingly, when at least one of input signals 151 through 153 is at a low level, an output signal becomes a low level and when all of the input signals 151 through 153 become a high level, then the output signal becomes a high level. In other words, the circuit in FIG. 4 is operated as a AND circuit.

However, in FIG. 4, when the input signals 151 through 153 becomes a high level and the internal signal 171 is in a high-to-low transition, a current flows through a series of four MOS transistor 103, 102, 101 and 400 despite only three input signals. Accordingly, there is a problem when a time taken from all of input signals being a high level to the internal signal 171 being in a low-to-high transition (and the output signal 170 being in a low-to-high transition) is longer than a time from when three MOS transistors are used.

FIG. 3 is a prior example circuit that improves the prior art circuit of FIG. 4. Although the circuit in FIG. 3 operates as an AND circuit just as the circuit in FIG. 4, when the input signals 151 through 153 become a high level and the internal signal 171 is in a high-to-low transition, a short period of time is allowed as compared with the circuit of FIG. 4 because a current flows through the three MOS transistors 103, 102 and 101.

SUMMARY OF THE INVENTION

In the circuit of FIG. 3, when a clock signal 160 becomes a low level at the time when all of the input signals 151 through 153 are a high level, a wasteful current flows from a power supply Vdd to a power supply Vss, via a P-channel type MOS transistor 100 and N-channel type MOS transistors 103 through 101. This current is called a through current.

In the aforementioned Japanese Patent Application No. 61-224623, it is described that when conductance of P-channel type MOS transistors 100 or 300 are made small, a through current becomes small. However, when a conductance of a P-channel type MOS transistor 100 is made small, a time required for the precharge becomes long because a current for charging a stray capacity floating at a node of the internal signal 171 at the time of the precharge is decreased.

An object of the present invention is therefore, to decrease a through current and to reduce a time required for the precharge while a signal propagation delay time from all of input signals being a high level to an output signal 170 being in a low-to-high transition is regulated not to be long.

An object of the present invention is to provide a circuit in which:
a clock signal is input, a plurality of input signals are input, an output signal is output, the output signal is set to a second level at the time the clock signal is a first level and the output signal is set to a level determined by the plurality of input signals at the time the clock signal is a reverse level of the first level,
and to provide a circuit for controlling a level of the plurality of input signal in response to the clock signal.

Another object of the present invention is to provide in a dynamic logic circuit configured in which:
at the time a clock signal is a first level, an output signal becomes a second level, at the time the clock signal is a reverse level of the first level, the output signal becomes a desired level determined by a plurality of input signals,
and to provide means for regulating at least one of the plurality of input signals forcibly to be the second level.

Another object of the present invention is to provide in a dynamic logic circuit configured in which:
there is provided a first MOS transistor of a first conductive type whose source electrode is connected with a first power supply and whose gate electrode is connected with a clock signal and also provided a second MOS transistor of a second conductive type, different from the first conductive type whose source electrode is connected with a second power supply, whose gate electrode is connected with a first input signal and whose drain electrode is connected with a drain electrode of the first MOS transistor directly or via other MOS transistors, and an output signal is taken and from a drain electrode of the first MOS transistor,
a third MOS transistor connected between a gate electrode of the second MOS transistor and the second power supply.

BRIEF DESCRIPTION OF THE DRAWINGS

The embodiments of the present invention are described below in conjunction with the figures, in which.

DESCRIPTION OF THE PREFERRED EMBODIMENT

A description will be given of the present invention by reference to the accompanying drawings.

Figure 1:
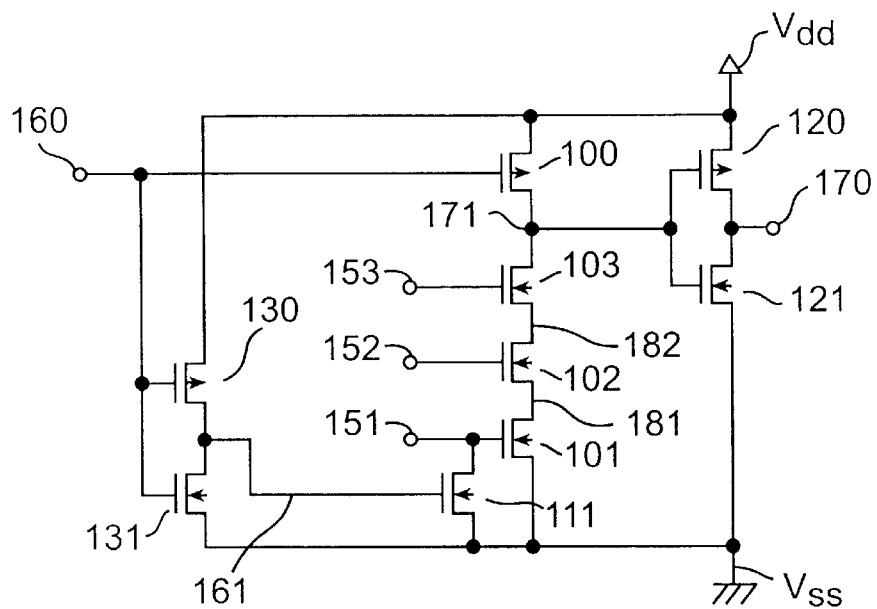
FIG. 1 shows a circuit diagram showing an example of an embodiment of a dynamic logic circuit based on the present invention.

FIG. 1 shows an example embodiment of a dynamic logic circuit based on the present invention. The dynamic logic circuit as in FIG. 1 includes P-channel type MOS transistors 100, 120, 130 and N-channel type MOS transistors 101 to 103, 111, 121, 131. The dynamic logic circuit is connected with power supplies on the side of a high voltage potential Vdd and on the side of a low voltage potential Vss. Input signals 151 through 153 and a clock signal 160 are input and an output signal 170 is output. This dynamic logic circuit has internal signals 161, 171, 181 and 182.

The operation of this dynamic logic circuit will now be described. When a clock signal 160 is at a low level, a P-channel type MOS transistor 100 is conducted and an internal signal 171 becomes a high level. An output signal 170 becomes a low level through an operation of an inverter configured by MOS transistors 120 and 121. This is a precharge status. Further, because an internal signal 161 becomes a high level through an operation of an inverter configured by MOS transistors 130 and 131, an N-channel type MOS transistor 111 is conducted. Thereafter, because an input signal 151 is forced to be a low level (or a voltage close to a low level), an N-channel type MOS transistor 101 achieves a cut-off status and a through current flowing through MOS transistors 100, 103, 102, 101 is reduced. When the clock signal 160 becomes a high level, the P-channel type MOS transistor 100 is cut off, the internal signal 161 becomes a low level through the operation of the inverter configured by the MOS transistors 130 and 131 and the N-channel type MOS transistor 111 is cut off as well. At this moment, when at least one of input signals 151 through 153 is a low level, at least one of the N-channel type MOS transistors 101 through 103 is cut off, the internal signal 171 achieves a floating status and is kept at a high level, and the output signal 170 is kept at a low level. When all of the input signals 151 through 153 become a high level, the N-channel type MOS transistors 101 through 103 all conduct, the internal signal 171 becomes a low level and the output signal 170 becomes a high level. As a result, the circuit in FIG. 1 operates as an AND circuit.

In the circuit of FIG. 1, because the amount of through current, flowing through MOS transistors 100, 103, 102, 101 at the time a clock signal 160 is a low level, is controlled by a N-channel type MOS transistor 101, it is possible to increase a value of a conductance of a P-channel type MOS transistor 100 without increasing the through current. Accordingly, a time required for an internal signal 171 being in a low-to-high transition and an output signal 170 being in a high-to-low transition (i.e., a time required for a precharge) can be reduced.

Moreover, when a clock signal 160 becomes a low level at the time an input signal 151 is at a high level, a through current flows through a circuit in a previous stage connected with the input signal 151 via a N-channel type MOS transistor 111. However, with respect to the present invention, if there is provided a dynamic logic circuit for the previous stage circuit where the precharged time is short, a time taken for flowing a through current is reduced because the input signal 151 becomes a low level in a short period of time.

Figure 2:
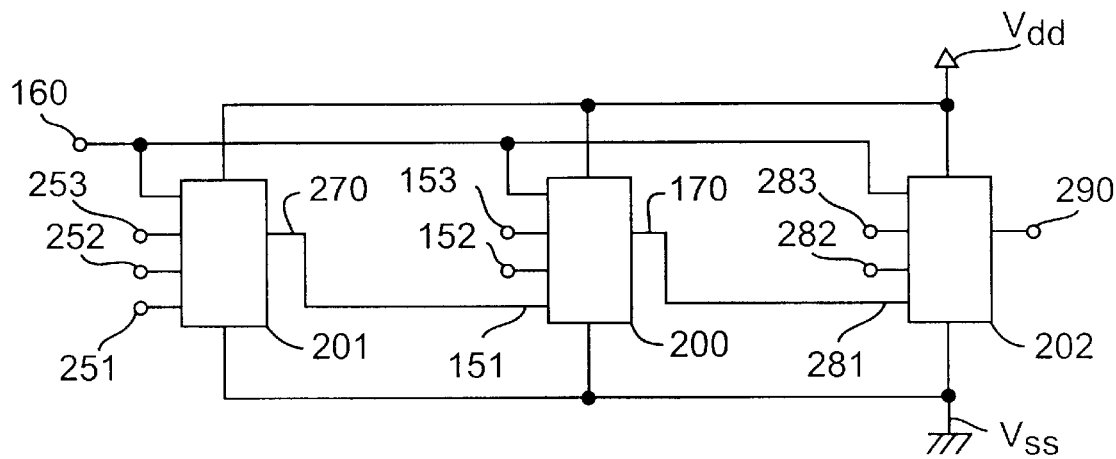
FIG. 2 shows a circuit block diagram showing another example of the embodiment when pluralities of the dynamic logic circuit of the present invention are connected.

The operation described above will now be done in conjunction with FIG. 2. FIG. 2 shows a circuit diagram indicating an example of an embodiment having a connection for dynamic logic circuits 200, 201, 202 based on the present invention. FIG. 2 includes a dynamic logic circuit 200, a previous stage dynamic logic circuit 201 and a later stage dynamic logic circuit 202. These dynamic logic circuits 200 through 202 are each assumed to be a dynamic logic circuit configuration in FIG. 1. A clock signal 160, a power supply on the side of a high voltage potential Vdd and a power supply on the side of a low voltage potential Vss are supplied for each dynamic logic circuit. Input signals 151 through 153 are input and an output signal 170 is output in the dynamic logic circuit 200. In the previous stage dynamic logic circuit 201, input signals 251 through 253 are input and an output signal 270 is output. In the later stage dynamic logic circuit 202, input signals 281 through 283 are input and an output signal 290 is output. The output signal 270 of the previous stage dynamic logic circuit 201 is input as an input signal 151 of the dynamic logic circuit 200 (an output node of the output signal 270 in the circuit 201 is connected with an input node of the input signal 151 in the circuit 200).

The output signal 170 of the dynamic logic circuit 200 is input as an input signal 281 of the later stage dynamic logic circuit 202 (an output node of the output signal 170 in the circuit 200 is connected with an input node of the input signal 281 in the circuit 202).

When a clock signal 160 becomes a low level in the circuit as in FIG. 2 dynamic logic circuits 200 through 202 are precharged all at once. If the output signal 270 and the input signal 151 are both at a high level just before the clock signal 160 becomes a low level, the P-channel type MOS transistor that corresponds to the P-channel type MOS transistor 120 of FIG. 1 in the previous stage dynamic logic circuit 201 conducts soon after the clock signal 160 becomes a low level.

Figure 3:
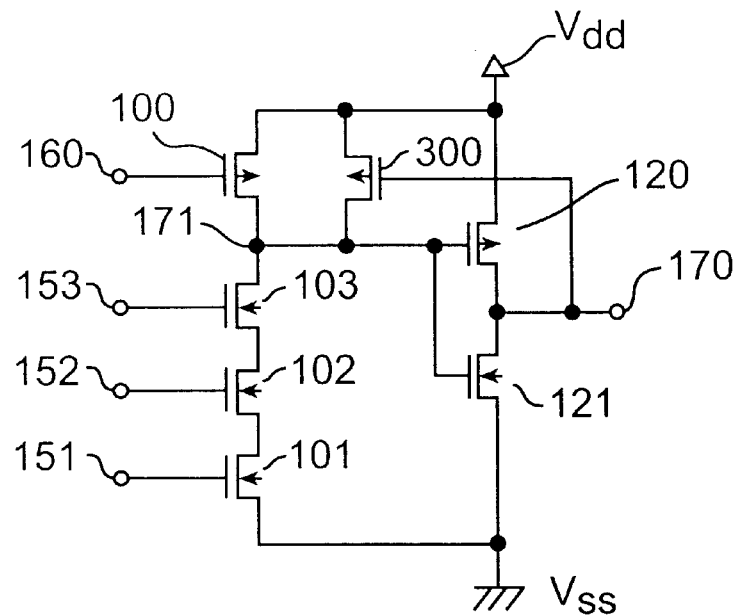
FIG. 3 shows a circuit diagram showing an example of the dynamic logic circuit of the prior art.

Accordingly, a through current flows through the P-channel type MOS transistor that corresponds to the P-channel type MOS transistor 120 of FIG. 1 in the previous stage dynamic logic circuit 201 and the N-channel type MOS transistor 111 in the dynamic logic circuit 200. At this moment, because a voltage of the input signal 151 is reduced to a voltage determined by a turn-on resistance of the P-channel type MOS transistor that corresponds to the P-channel type MOS transistor 120 of FIG. 1 in the previous stage dynamic logic circuit 201 and the N-channel type MOS transistor 111 in the circuit 200, a value of the turn-on resistance of the N-channel type MOS transistor 101 in the circuit 200 becomes large as compared with the input signal 151 being a high level (i.e., shown in the prior art circuit of FIG. 3).

Therefore, the internal signal 171 of the circuit 200 is in a low-to-high transition more quickly than the input signal 151 being a high level and the output signal 170 is in a high-to-low transition more quickly. Because the same event happens as well in the previous stage dynamic logic circuit 201, the P-channel type MOS transistor that corresponds to the P-channel type MOS transistor 102 of FIG. 1 in the previous stage dynamic logic circuit 201 achieves a cut-off status more quickly. Then, a time for the through current to flow through the MOS transistor 120 becomes short.

Furthermore, when there is a distance between the previous stage dynamic logic circuit 201 and the circuit 200, a wiring resistance in a wiring connected between an output signal 270 in the circuit 201 and the input signal 151 in the circuit 200 can not be ignored. Because an electronic element for decreasing a voltage of the input signal 151 is only included in the circuit 201 when the prior art circuit is employed, if the wiring resistance becomes large, it takes a time to decrease a voltage of the input signal 151 and to perform the precharge. When a circuit of FIG. 1 based on the present invention is employed, there exists the N-channel type MOS transistor 111 for decreasing a voltage of the input signal 151 in the circuit 200. Therefore, when the wiring resistance becomes large, a time necessary for decreasing the voltage of the input signal 151 becomes short and a time necessary for the precharge becomes even shorter.

Figure 4:
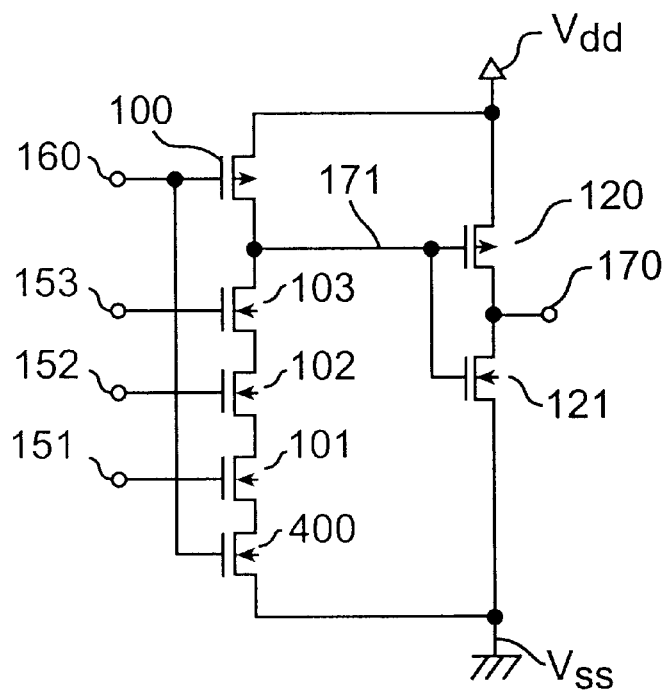
FIG. 4 shows a circuit diagram showing another example of the dynamic logic circuit of the prior art.

Because, in the circuit of FIG. 1, there is a connection between a node of the internal signal 171 and the power supply on the side of a low voltage potential Vss by three N-channel type MOS transistors 101 and 103, a problem of the prior art circuit in FIG. 4 connected with more MOS transistors than the number of input lines can be solved.

Figure 5:
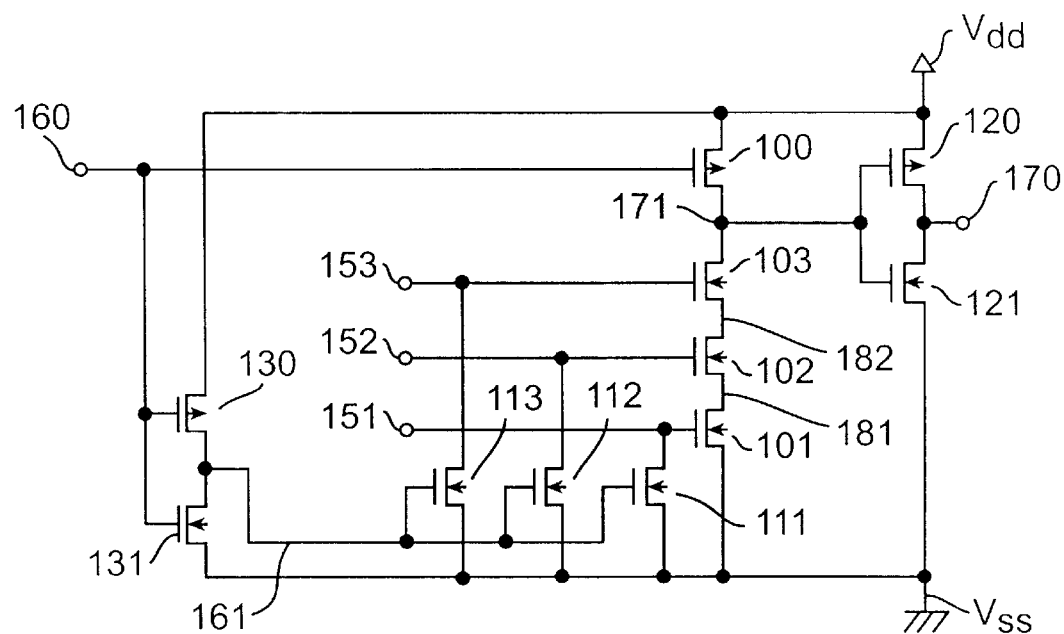
FIG. 5 shows a circuit diagram showing another example of the embodiment of the dynamic logic circuit based on the present invention.

FIG. 5 shows another example of the embodiment of a dynamic logic circuit based on the present invention. A circuit of FIG. 5 has a configuration that adds N-channel type MOS transistors 112 and 113 to the circuit of FIG. 1 and when the precharge is done for all of the input signals 151 through 153, the N-channel type MOS transistors 111 through 113 are provided for forcibly decreasing forcibly each level of the input signals 151 through 153 to a low level. Therefore, in the circuit of FIG. 5, a N-channel type MOS transistor 121 in a previous stage circuit plays the role of keeping low the output signal 170 being in a high-to-low transition and it is possible to set a conductance of the N-channel type MOS transistor 121 to be small thereby making it somewhat possible to neglect the MOS transistor 121.

Figure 6:
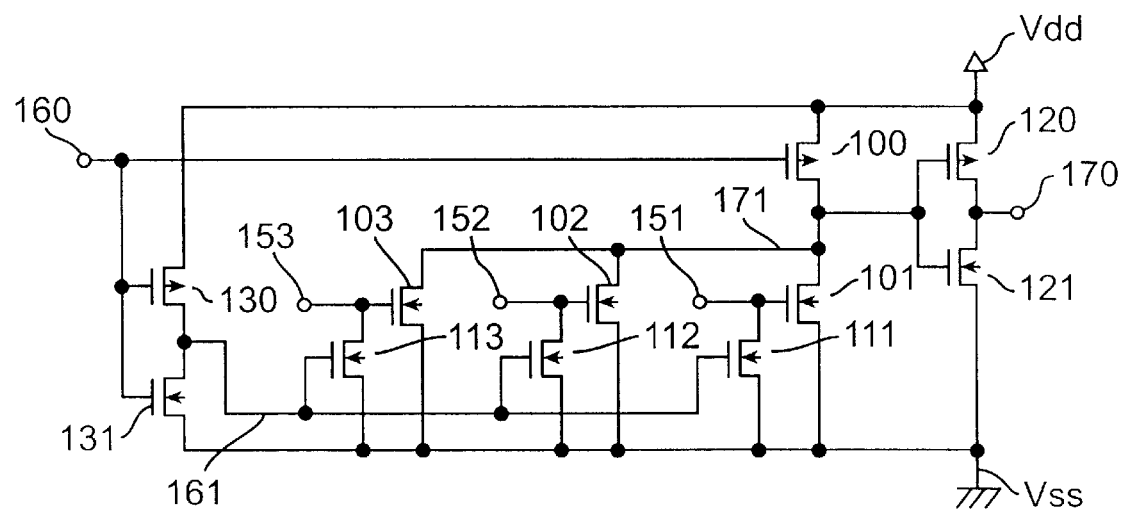
FIG. 6 shows a circuit diagram showing still another example of the embodiment of the dynamic logic circuit based on the present invention.

FIG. 6 shows still another example of the embodiment of a dynamic logic circuit based on the present invention. In the circuit of FIG. 6, because N-channel type MOS transistors 101 through 103 are in parallel between a node of an internal signal 171 and a power supply on the side of a low voltage potential Vss, an output signal 170 becomes low level only when all of the input signals 151 through 153 are at a low level and when one of the input signals 151 through 153 is at a high level, the output signal 170 becomes a high level. In other words, the circuit of FIG. 6 operates as an OR circuit.

Figure 7:
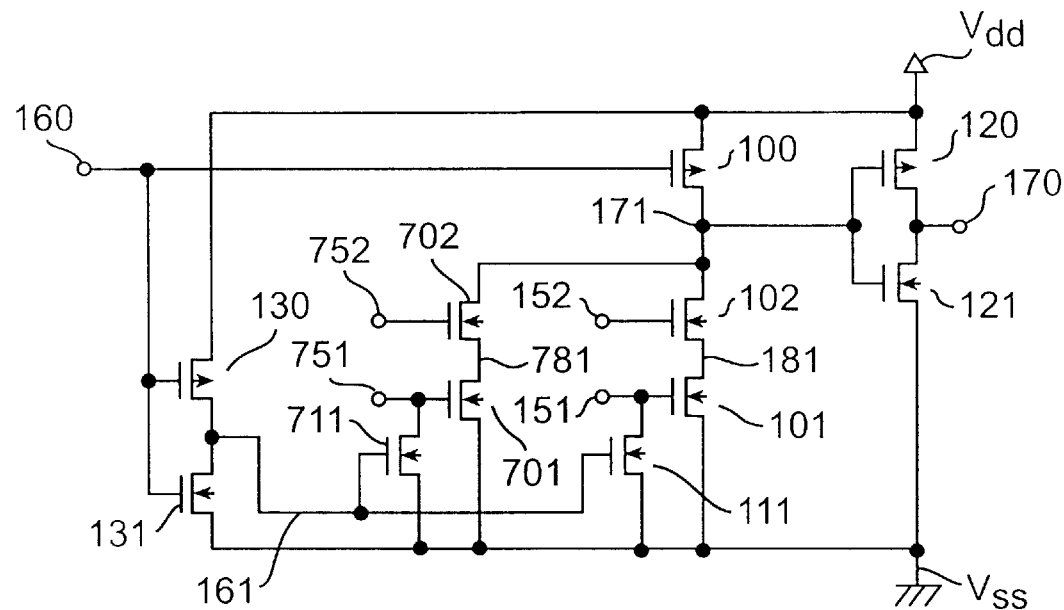
FIG. 7 shows a circuit diagram showing still another example of the embodiment of the dynamic logic circuit based on the present invention.

FIG. 7 shows still another example of the embodiment of a dynamic logic circuit based on the present invention. A circuit of FIG. 7 includes N-channel type MOS transistors 701, 702, 711 and input signals 751, 752. In the circuit of FIG. 7, because N-channel type MOS transistors 101, 102, 701, 702 connected in series are in parallel between a node of an internal signal 171 and a power supply on the side of a low voltage potential Vss, the circuit operates as a combination circuit of an AND-OR type. That is, when input signals 151 and 153 are both high level or input signals 751 and 752 are both high level, an output signal 170 becomes a high level. When either one of input signals 151 or 152 is at a low level and either one of input signals 751 or 752 is at a low level, the output signal 170 becomes a low level.

Figure 8:
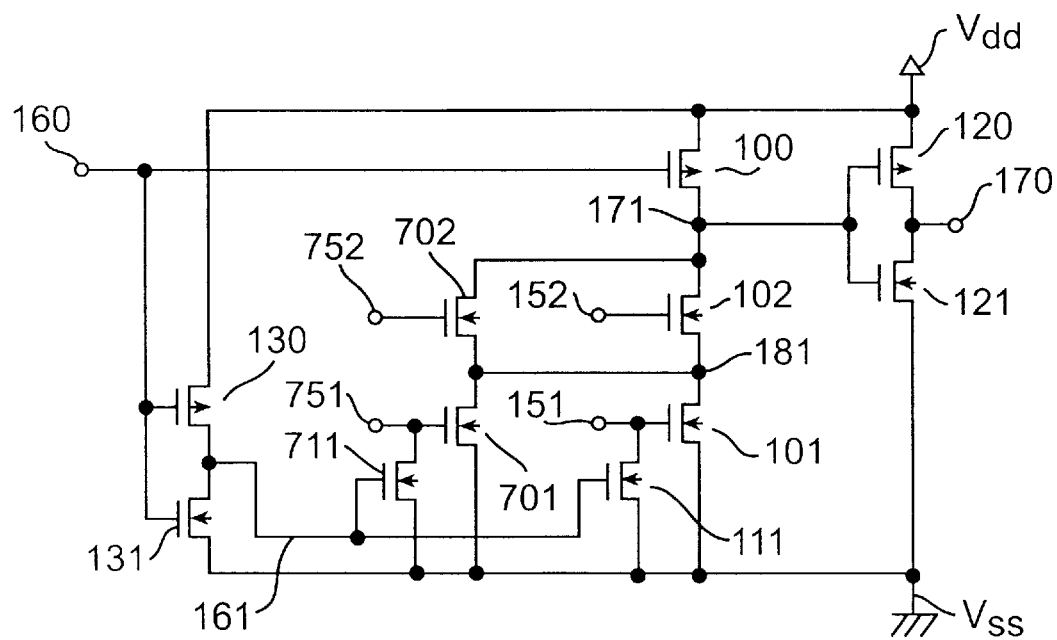
FIG. 8 shows a circuit diagram showing still another example of the embodiment of the dynamic logic circuit based on the present invention.

FIG. 8 shows still another example of the embodiment of a dynamic logic circuit based on the present invention. In the circuit of FIG. 8, because N-channel type MOS transistors 101, 701 and 102, 702 connected in parallel are in series between a node of an internal signal 171 and a power supply on the side of a low voltage potential Vss, the circuit itself operates as a combination circuit of an OR-AND type. That is, when either one of input signals 151 or 751 is a high level and either one of input signals 152 or 752 is a high level, an output signal 170 becomes a high level. When input signals 151 and 751 are both low level or input signals 152 and 752 are both low level, an output signal 170 becomes a low level.

Although FIGS. 7 and 8 show a configuration that provides N-channel type MOS transistors 111 and 711 for decreasing forcibly to a low level, at the time of the precharge only, input signals 151 and 751 connected with N-channel type MOS transistors 101 and 701 directly connected with a power supply on the side of a low voltage potential Vss. Just as the circuit of FIG. 1 can be changed to the circuit of FIG. 5, it is possible to provide a N-channel type MOS transistor for decreasing forcibly to a low level, at the time of the precharge, all of input signals including 152 and 752. Additionally, it is possible to set small a conductance of a N-channel type MOS transistor 121 in the previous stage circuit as well as in FIG. 5 or to thereby make it somewhat possible to neglect the N-channel type MOS transistor 121.

Figure 9:
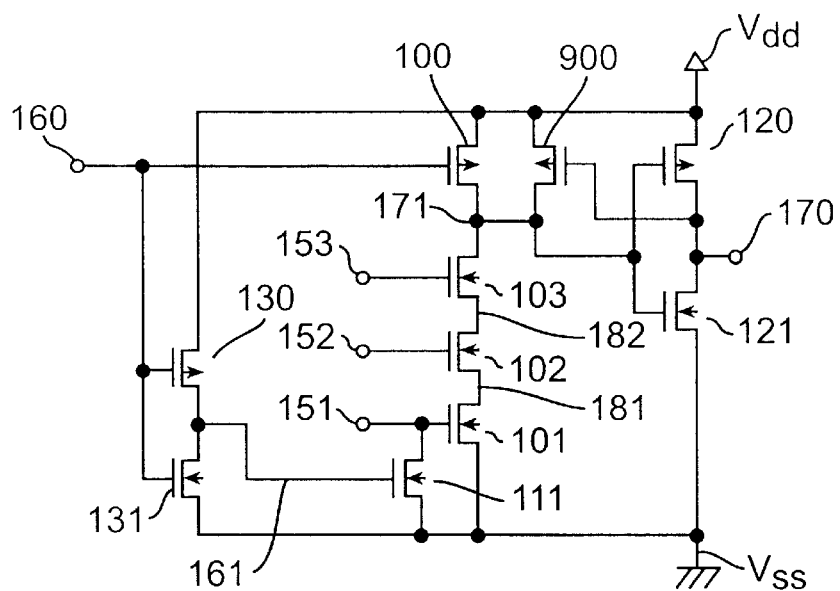
FIG. 9 shows a circuit diagram showing still another example of the embodiment of the dynamic logic circuit based on the present invention.
Figure 10:
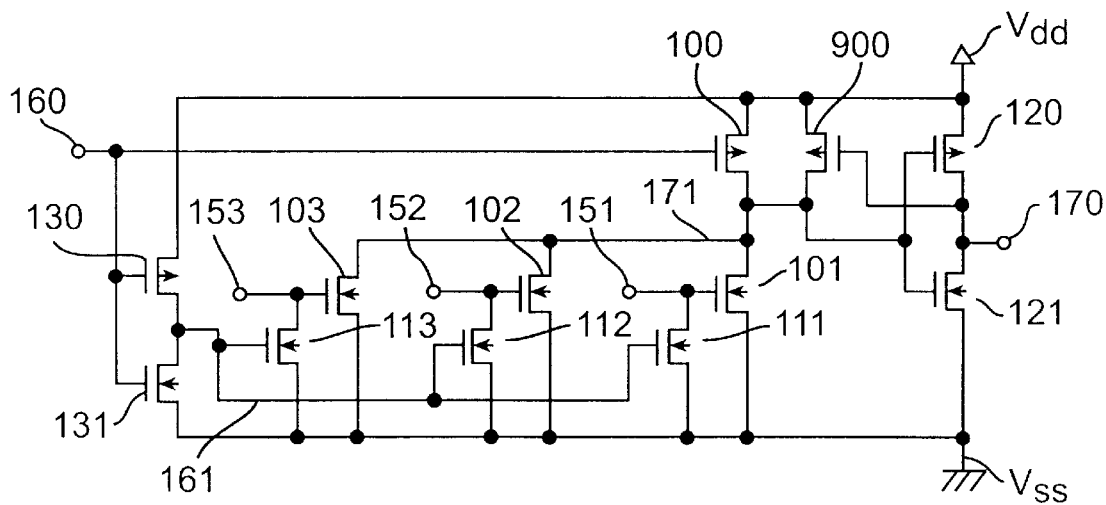
FIG. 10 shows a circuit diagram showing still another example of the embodiment of the dynamic logic circuit based on the present invention.

FIGS. 9 and 10 show still another example of the embodiment of a dynamic logic circuit based on the present invention. The circuits of FIGS. 9 and 10 add a P-channel type MOS transistor 900 to the circuits of FIGS. 1 or 6 and feeds a signal from an output signal 170 back to an internal signal 171. The purpose of adding the MOS transistor 900 is to avoid the decrease of the internal signal 171 to a low level by a leak current when the internal signal 171 becomes a high level under a floating status. That is, when the internal signal 171 is a high level, the output signal 170 becomes a low level and the P-channel type MOS transistor 900 conducts. Therefore, a floating status of the internal signal 171 can be avoided. The MOS transistor 900 is an electronic element for keeping the internal signal 171 at a high level. Thus, thereby it is not necessary to increase the value of conductance of the MOS transistor 900. For restricting the influence of the operation of N-channel type MOS transistors 101 through 103 upon a signal propagation time, the conductance of the MOS transistor 900 is set to be smaller than the N-channel type MOS transistors 101 through 103 and a P-channel type MOS transistor 100. Meanwhile, it is possible for circuits of FIGS. 5, 7 and 8 to provide the P-channel type MOS transistor 900.

Figure 11:
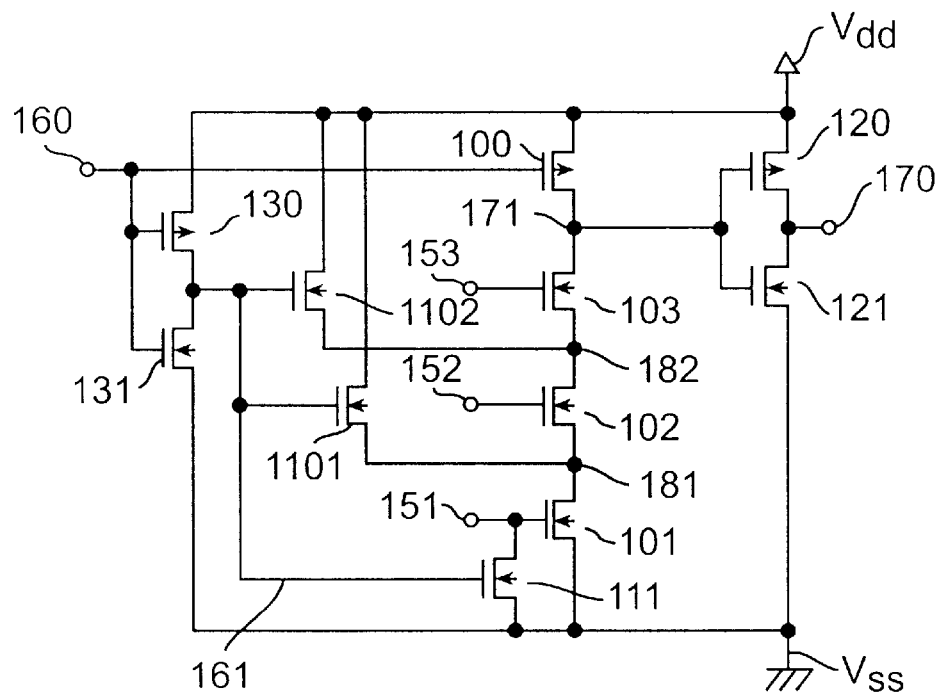
FIG. 11 shows a circuit diagram showing still another example of the embodiment of the dynamic logic circuit based on the present invention.
Figure 12:
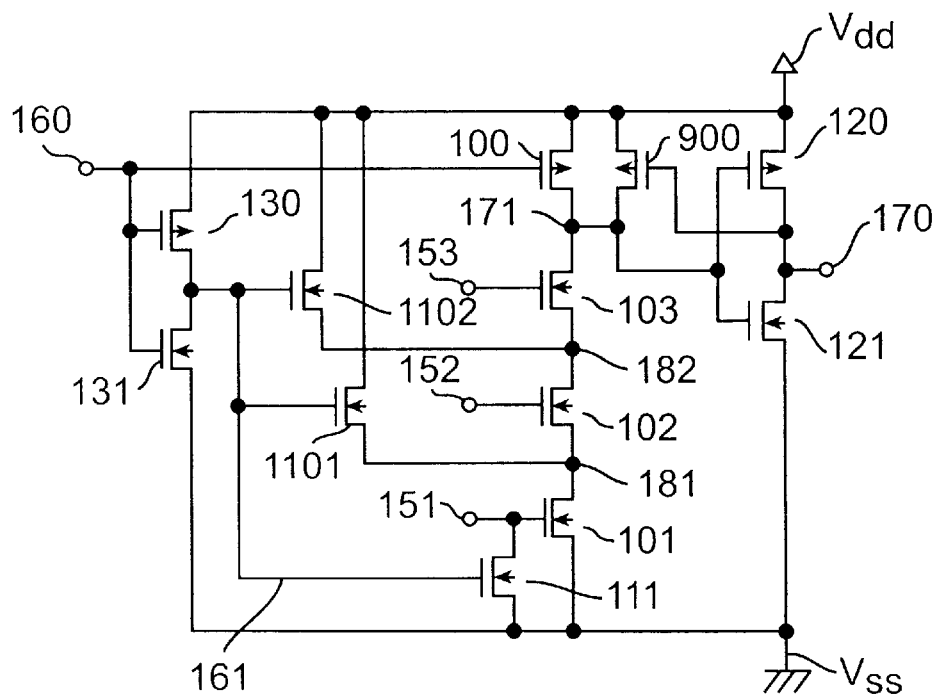
FIG. 12 shows a circuit diagram showing still another example of the embodiment of the dynamic logic circuit based on the present invention.

FIGS. 11 and 12 show still another example of the embodiment of a dynamic logic circuit based on the preset invention. These circuits add N-channel type MOS transistors 1101 and 1102 to the circuits of FIGS. 1 or 9. The purpose of adding the MOS transistors 1101 and 1102 is to raise internal signal 181 and 182 at the connection point of N-channel type MOS transistors 101 through 103 to a voltage close to a high level at the time of the precharge.

In other words, when input signals 151 and 152 are at a high level and an input signal 153 is at a low level just before a clock signal 160 is at a low level, N-channel type MOS transistors 101 and 102 conduct a N-channel type MOS transistor 103 is cut off. Because of this cut off, internal signals 181 and 182 become low level. Thereafter, when a clock signal 160 becomes a low level, input signals 151, 152 become low level as well by the precharge of the previous stage circuit and N-channel type MOS transistors 101 through 103 are all cut off. At this moment, in the circuits of FIGS. 1 and 9, the internal signals 181 and 182 are kept at a low level. Assuming that the clock signal 160 becomes a high level, the precharge status is over and while the input signal 151 is kept at a low level, the input signals 152 and 153 become high level. Although a voltage of an internal signal 171 must be kept at a high level, because of a charge share by a stray capacity occurring at nodes of internal signals 171, 181 and 182, the voltage of the internal signal 171 is decreased by an amount corresponding to a ratio of a stray capacity value. When a level of the decrease is beyond a threshold value of an inverter configured by MOS transistors 120 and 121, an erroneous operation occurs.

Circuits of FIGS. 11 and 12 provide N-channel type MOS transistors 1101 and 1102 for preventing the erroneous operation. In the circuits of FIGS. 11 and 12, because the N-channel type MOS transistors 1101 and 1102 are conducted at the time of the precharge, internal signals 181 and 182 shift their signals up to high level (strictly, a lower voltage than the high level by a threshold voltage of the MOS transistors 1101 and 1102). Accordingly, even if the precharge status is over and input signals 152 and 153 become high level while an input signal 151 is kept a low level, there is almost no voltage drop by the charge share. Then, the error operation can be prevented.

Moreover, a preparation of only a N-channel type MOS transistor 1102 is enough dependent on an amount of the stray capacity occurring at nodes of internal signals 171, 181, 182, and on the other hand, there if no need to provide the N-channel type MOS transistors 1101 and 1102.

Although there is a configuration for providing a P-channel type MOS transistor instead of N-channel type MOS transistors 1101 and 1102 for the same purpose, when the P-channel type MOS transistor is provided, a clock signal 160 is connected with a gate electrode of the P-channel type MOS transistor and a load of the clock signal 160 increases. Then, the clock skew of the clock signal 160 in a LSI chip mounting the P-channel type MOS transistor increases. On the other hand, when N-channel type MOS transistors 1101 and 1102 are provided as shown in the circuits of FIGS. 11 and 12, an internal signal 161 connected with each gate electrode of the N-channel type MOS transistors 1101 and 1102 is in common with the internal signal 161 connected with a gate electrode of a MOS transistor 111. Therefore, the load of the clock signal 160 does not increase and it is possible for circuits of FIGS. 5, 7 and 8 to provide the N-channel type MOS transistor.

Figure 13:
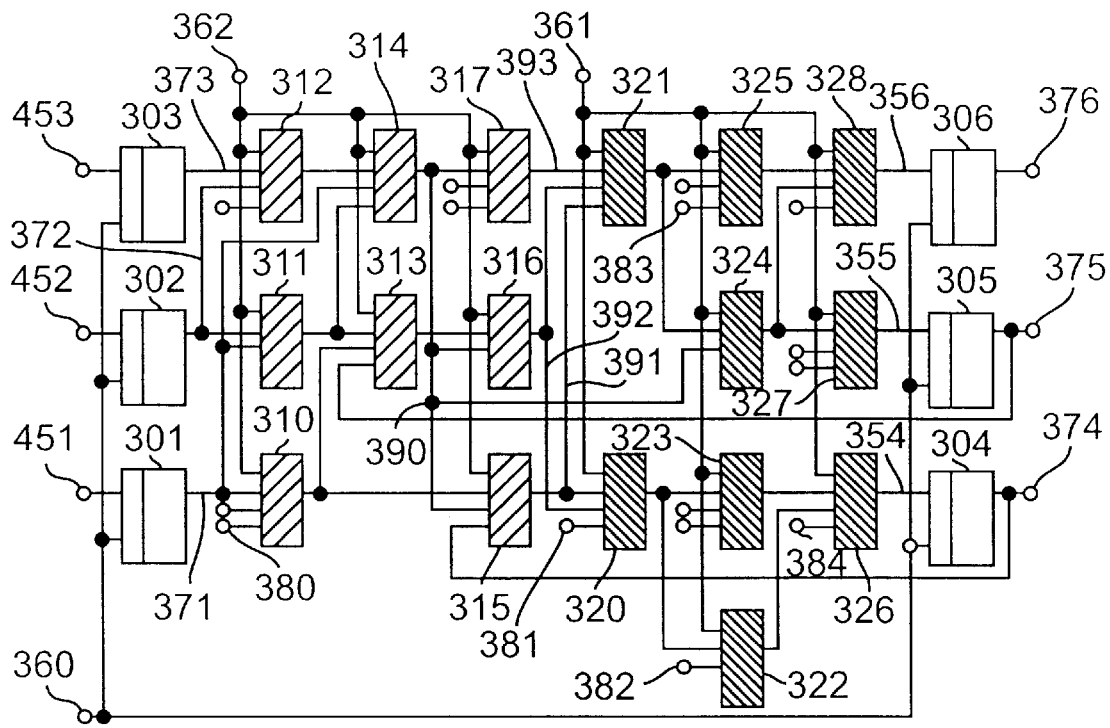
FIG. 13 shows a circuit diagram showing an example of the embodiment when a circuit block having logic function by using the dynamic logic circuit of the present invention is configured.

FIG. 13 shows an example embodiment when a circuit block including a plurality of logic functions is configured by employing a dynamic logic circuit based on the present invention, and includes dynamic logic circuits 310 through 317 and 320 through 328 based on the present invention and flip-flop circuits 301 through 306. What is provided is a clock signal 360 of the flip-flop circuits 301 through 306, a clock signal 361 of the dynamic logic circuits 320 through 328, a clock signal 362 of the dynamic logic circuits 310 through 317, output signals 371 through 376 of the flip-flop circuits 301 through 306, input signals 354 through 356 of flip-flop circuits 304 through 306 and input signals 451 through 453 of flip-flop circuits 301 through 303.

Moreover, output signals 371 through 373 of flip-flop circuits 301 through 303 and the input signals 354 through 356 of the flip-flop circuits 304 through 306 are internal signals in the circuit block shown in FIG. 13. The input signals 451 through 453 of flip-flop circuits 301 through 303 and an output signal 376 of a flip-flop circuit 306 are signals connected with a portion other than the circuit block as in FIG. 13. Output signals 374 and 375 of flip-flop circuits 304 and 305 are internal signals in the circuit block shown in FIG. 13 and are also output signals connected with a portion other than the circuit block. An input signal of a dynamic logic circuit is supplied to terminals 380 through 384 and other terminals. These input signals are supplied from a portion other than the circuit block as in FIG. 13. Further, there is provided signals 390 through 393 that output from dynamic logic circuits 310 through 317 and inputs to dynamic logic circuits 320 through 328. In other words, a signal coming from a node connecting the dynamic logic circuits 310 through 317 for receiving a clock signal 362, and going to the dynamic logic circuits 320 through 328 for receiving a clock signal 361.

Figure 17:
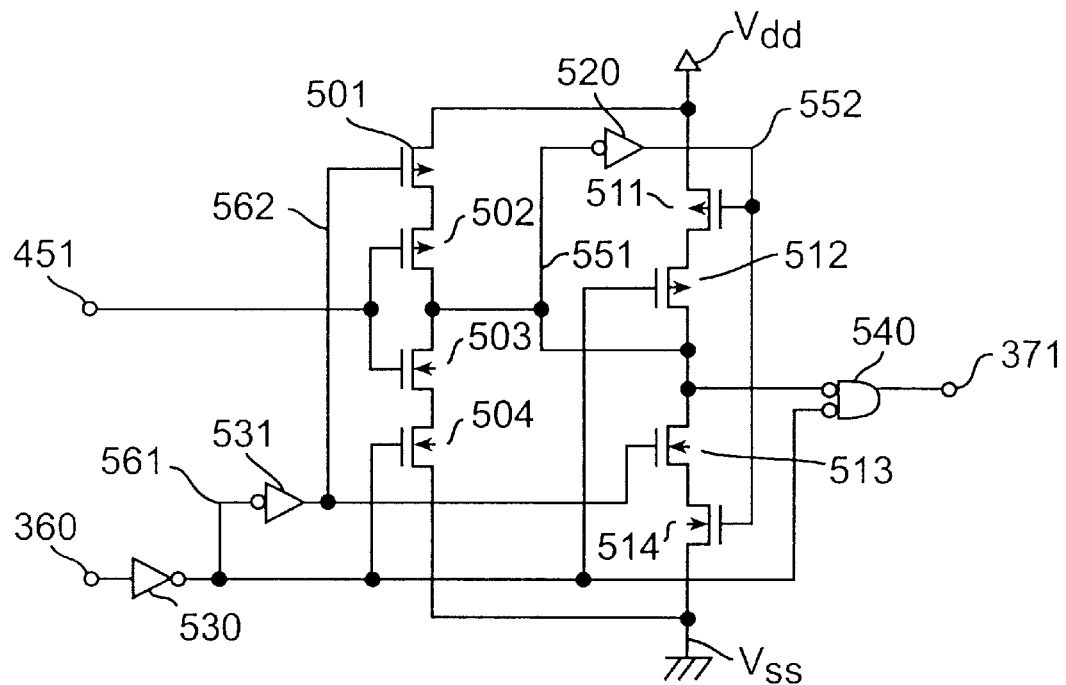
FIG. 17 shows a circuit diagram showing an example of an embodiment for a flip-flop circuit useful for a configuration element of the circuit block of FIG. 13.
Figure 18:
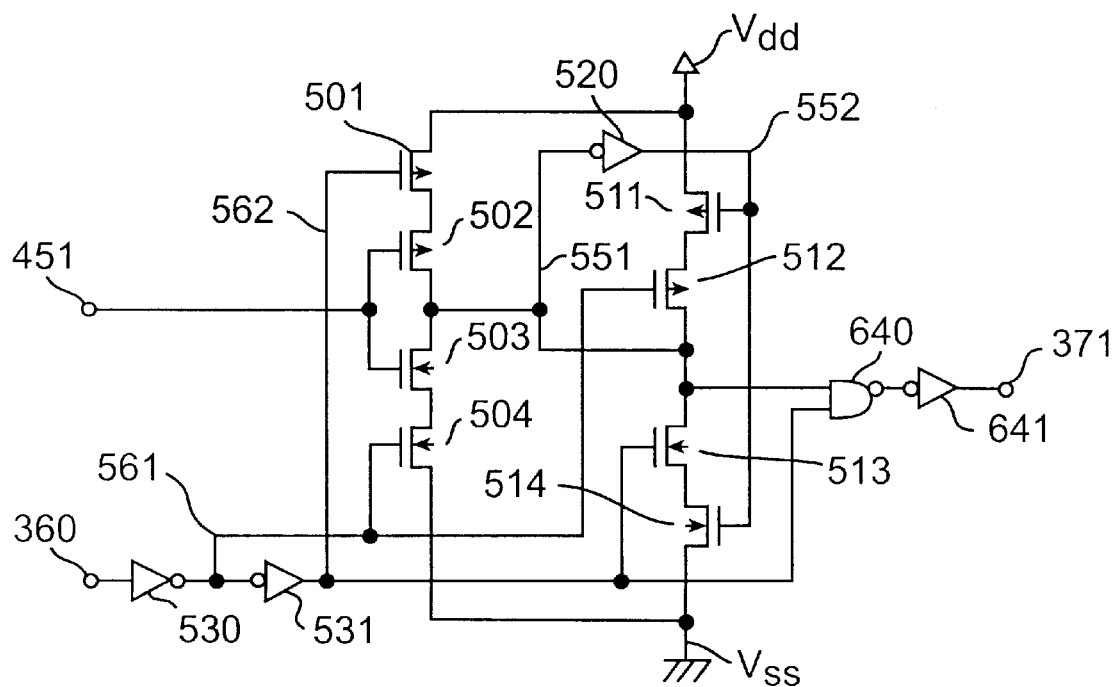
FIG. 18 shows a circuit diagram showing another example of the embodiment for the flip-flop circuit useful for a configuration element of the circuit block of FIG. 13.

Flip-flop circuits 301 through 306 used in the circuit block of FIG. 13 are supposed to be flip-flop circuits where output signals 371 through 376 become low level at the time a clock signal 360 is at a low level and at the time the clock signal 360 is at a high level, a signal corresponding to input signals 451 through 453 and 354 through 356 just before the clock signal 360, being a high level, is output. One configuration of the above-mentioned flip-flop circuits is shown in FIGS. 17 and 18.

Although dynamic logic circuits 310 through 317 and 320 through 328 are the dynamic logic circuits of the present invention as shown in FIGS. 1, 5 through 12, there is a configuration that replaces a portion of the above dynamic logic circuits with the prior art dynamic logic circuit of FIG. 4.

Figure 14:
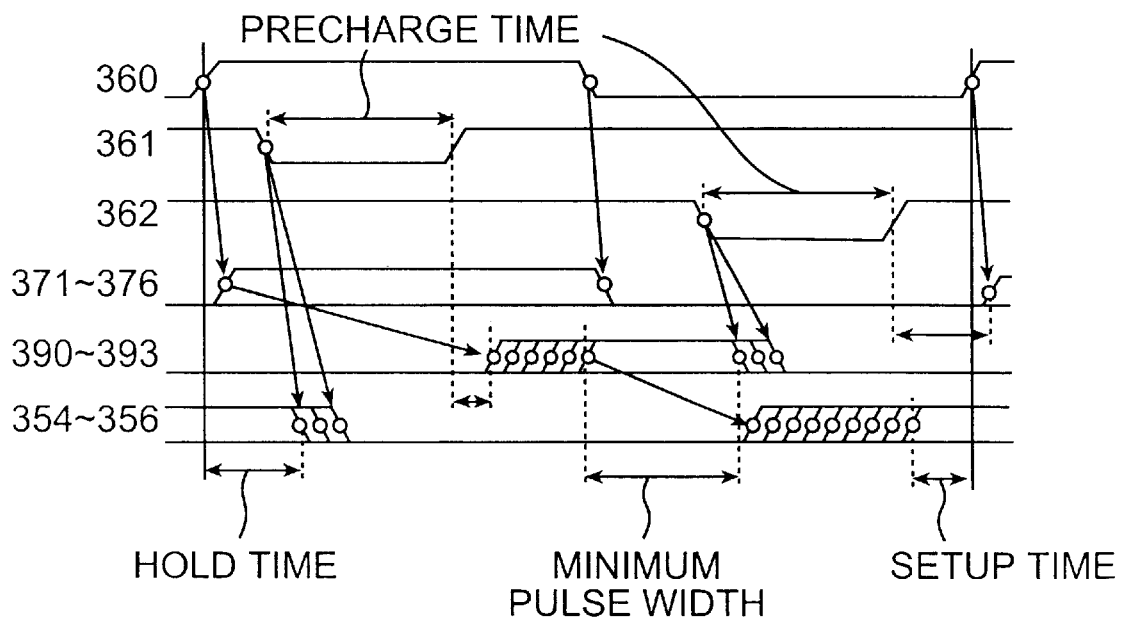
FIG. 14 shows timing chart showing a circuit block operation of FIG. 13.

FIG. 14 shows a timing chart of clock signals 360 through 362 in the circuit block of FIG. 13, output signals 371 through 376 of a flip-flop circuit, internal signals 390 through 393 and input signals 354 through 356 of a flip-flop circuit. As in FIG. 14, during a period of a clock signal 360 being at a low level, the output signals 371 through 376 of the flip-flop circuit are at a low level. However, when the clock signal 360 is in a low-to-high transition, any of the output signals 371 through 376 become in a low-to-high transition in response to input signals 451 through 453 and 354 through 356. Then, any of the internal signals 390 through 393 become in a low-to-high transition by propagating through dynamic logic circuits 310 through 317 and thereafter, all of internal signals 354 through 356 become in a low-to-high transition by propagating through dynamic logic circuits 320 through 328. At this moment, if the input signals reach internal signals 354 through 356 until a low-to-high transition time of the next cycle of the clock signal 360, any of output signals 374 through 376 become in a low-to-high transition in response to the internal signals 354 through 356 in the next cycle. In the same manner, if input signals 451 through 453 from the previous stage circuit block reach until a low-to-high transition time of the next cycle of the clock signal 360, any of the output signals 371 through 373 become in a low-to-high transition in response to the input signals 451 through 453 in the next cycle. By repeating the above process, a desired logic operation is performed.

When a clock signal 361 is in a high-to-low transition, dynamic logic circuits 320 through 328 are precharged and internal signals 354 through 356 become low level. When a clock signal 362 is in a high-to-low transition, dynamic logic circuits 310 through 317 are precharged and internal signals 390 through 393 become low level.

There are some restrictions regarding a time when internal signals 354 through 356 and internal signals 390 through 393 are in a low-to-high transition and regarding a time when the internal signals 354 through 356 and the internal signals 390 through 393 are in a high-to-low transition.

The internal signals 354 through 356 must be in a low-to-high transition before a designated time (normally, so called set up time of a flip-flop) for a low-to-high transition time of a clock signal 360 and must be in a high-to-low transition after a designated time (normally, so called hold time of a flip-flop) for a low-to-high transition time of the clock signal 360 so that the internal signals 354 through 356 are correctly input to flip-flop circuits 304 through 306.

The internal signals 390 through 393 must be in a low-to-high transition after a clock signal 361 is in a low-to-high transition and the precharge of the dynamic logic circuits 320 through 328 is completed so that the internal signals 390 through 393 are in a low-to-high transition and transferred to the dynamic logic circuits 320 through 328 without a propagation delay. Further, internal signals 390 through 393 must be in a high-to-low transition after a time beyond a minimum pulse width required for transferring a signal correctly to the dynamic logic circuits 320 through 328. A clock signal 362 must be in a low-to-high transition and dynamic logic circuits 310 through 317 must be precharged by the time when the clock signal 360 is in a low-to-high transition and internal signals 371 through 376 are in a low-to-high transition.

For satisfying the above restriction and shortening a period of the clock signal 360, a circuit whose signal propagation time is short is used as the dynamic logic circuits 310 through 317 and the dynamic logic circuits 320 through 328. Simultaneously, it is preferred that a time for the clock signals 361 and 362 to be a low level (i.e., a time for the precharge) is short. To achieve this objective, it is preferred that the dynamic logic circuit based on the present invention whose signal propagation time is short and which needs the least time required for the precharge be used as the dynamic logic circuits 310 through 317 and the dynamic logic circuits 320 through 328.

Further, for satisfying the aforementioned restriction, it is necessary for the clock signal 362 to be in a low-to-high transition before the clock signal 360 being in a low-to-high transition and the clock signal 361 must be in a high-to-low transition after at least a hold time of a flip-flop from a low-to-high transition of the clock signal 360. It is necessary for a period between a low-to-high transition of the clock signal 361 and a high-to-low transition of the clock signal 362 to be a time interval beyond a time corresponding to a minimum pulse width of the internal signals 390 through 393.

Figure 15:
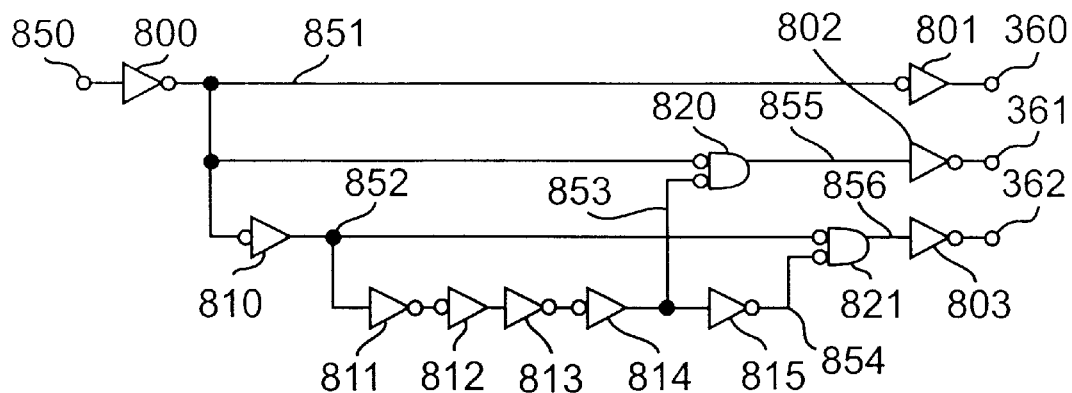
FIG. 15 shows a circuit diagram showing an example of an embodiment for a circuit that supplies a clock signal to the circuit block of FIG. 13.

FIG. 15 shows an example of the embodiment of a circuit for supplying clock signals 361 and 362 to dynamic logic circuits 310 through 317 and dynamic logic circuits 320 through 328 used for the circuit block of FIG. 13. In FIG. 15, there is provided inverters 800 through 803 and 810 through 815, NOR circuits 820 and 821, clock signals 360 through 362 of FIG. 13, an original clock signal 850 of the clock signals 360 through 362 and nodes 851 through 856 of internal signals in the circuit of FIG. 15.

Figure 16:
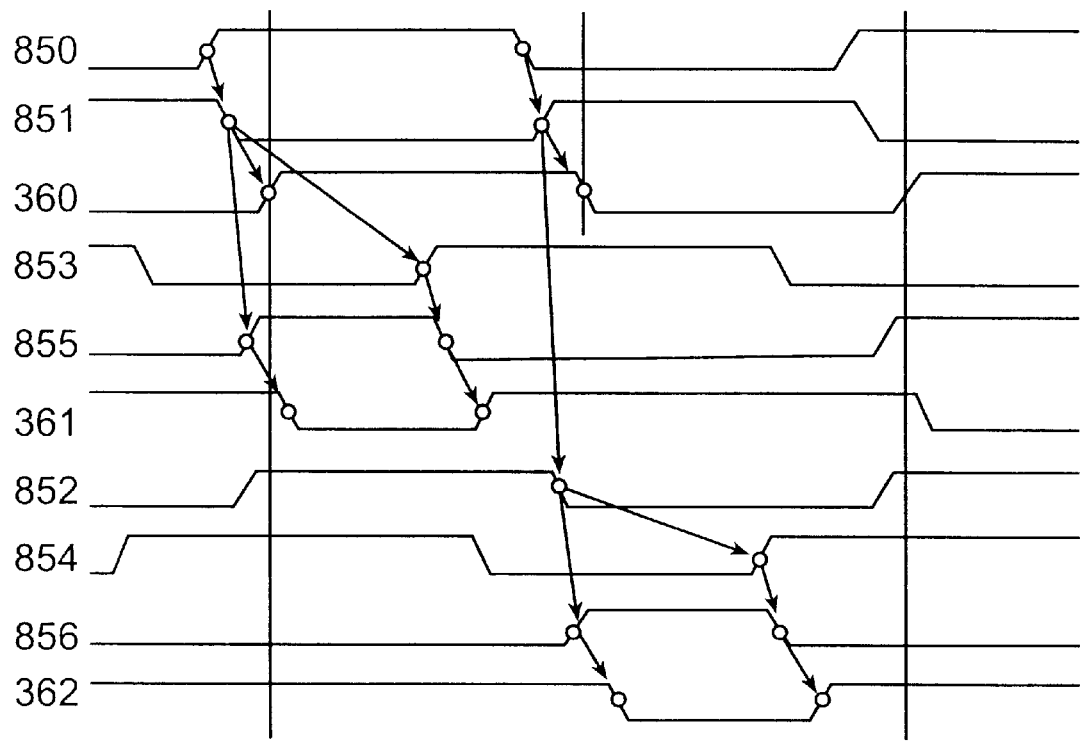
FIG. 16 shows a timing chart showing a circuit operation of FIG. 15.

FIG. 16 shows a timing chart for each signal of FIG. 15. As in FIG. 16, a clock signal 360 is a delayed version of a clock signal 850 caused by inverters 800 and 801. A clock signal 361 is a signal made from a low-to-high transition edge of the clock signal 850, is in a high-to-low transition delayed by a delay time through an inverter 800, a NOR circuit 820 and an inverter 802 from the low-to-high transition edge of the clock signal 850 and is in a low-to-high high transition delayed by a delay time through inverters 810 through 814 from a time in the high-to-low transition of the clock signal 361. A clock signal 362 is a signal made from a high-to-low transition edge of the clock signal 850, is in a high-to-low transition delayed by a delay time through inverters 800, 810, a NCR circuit 821 and an inverter 803 from the high-to-low transition edge of the clock signal 850 and is in a low-to-high transition delayed by a delay time through inverters 811 through 815 from a time in the high-to-low transition of the clock signal 362. A clock pulse timing relation between clock signals 360, 361 and 362 can be regulated by designing size of MOS transistor that configures NOR circuits 820, 821, inverters 801–803 and 810. A pulse width of clock signals 361 and 362 can be regulated by selecting the number of stages of inverters 810 through 815 and size of MOS transistor that configures these inverters. Through the above regulation, a clock pulse timing relation of clock signals 360, 361 and 362 is set so that a clock timing of each signal shown in FIG. 14 satisfies the above-mentioned restriction.

FIG. 17 shows an example circuit diagram for flip-flop circuits 301 through 306 useful for the circuit block of FIG. 13. In this figure, there is provided P-channel type MOS transistors 501, 502, 511, 512, N-channel type MOS transistors 503, 504, 513, 514, inverters 520, 530, 531 and a NOR circuit 540. There is also provided an input signal 451, a clock signal 360, an output signal 371 and nodes 551, 552, 561 and 562 of internal signals in this circuit.

In this circuit of FIG. 17, when a clock signal 360 is a low level, an internal signal 561 becomes a high level and an output signal 371 becomes a low level. At this moment, because MOS transistors 501 and 504 are conducted, a reversed signal of an input signal 451 appears as an internal signal 551 and further still a reversed signal of the reversed signal of the input signal 451 appears as an internal signal 552. MOS transistors 512 and 513 are cut off. Thereafter, when the clock signal 360 becomes a high level, the internal signal 561 becomes a low level and a reversed signal of the internal signal 551 (i.e., the same signal as an input signal 451) appears in the output signal 371. Simultaneously, because MOS transistors 512 and 513 are conducted, the status at that moment is kept in the internal signals 551 and 552, since MOS transistors 501 and 504 are cut off, despite the change of the input signal 451, that causes no influence. When the clock signal 360 is a low level, the output signal 371 becomes a low level and when the clock signal 360 is a high level, this circuit operates as a flip-flop circuit that outputs the same signal as the input signal 451 for the output signal 371 just before the clock signal 360 being a high level.

FIG. 18 shows another example circuit diagram of flip-flop circuits 301 through 306 useful for the circuit block of FIG. 13. FIG. 18 replaces a NOR circuit 540 of FIG. 17 with a NAND circuit 640 and an inverter 641, and has a configuration that exchanges a polarity of a clock signal added to the NAND circuit 640. Although an operation of this circuit is the same as an operation of the circuit in FIG. 17, there is a difference between both circuits where an output signal 371 from the circuit of FIG. 18 when a clock signal 360 is a high level becomes a reversed signal of an input signal 451 just before the clock signal 360 being a high level.

The aforementioned dynamic logic circuits can improve the whole performance of a semiconductor integrated circuit by integrating themselves into the semiconductor integrated circuit because the precharge time of the dynamic logic circuits can be reduced.

In the semiconductor integrated circuit configured by a static circuit network and a dynamic circuit network, by applying the embodiments of the present invention into a circuit in a part of the dynamic circuit network, the part of the dynamic circuit network is available for a high speed operation as compared with the conventional art and a speed of the part of the dynamic circuit network whose timing design is difficult in the semiconductor integrated circuit configured by the static circuit network and the dynamic circuit network is improved. In FIG. 13, there is provided a configuration that has a static circuit connected with a previous stage of flip-flops 301 through 303 and has another static circuit connected with the later stage of flip-flops 304 through 306.

Specifically, when an output signal 376 of the circuit block as in FIG. 13 is output to a static logic circuit, for a flip-flop circuit 306, when a clock signal 360 is a high level, the same signal as an input signal 356 (or a reversed signal of the input signal 356) is output as an output signal 376 just before the clock signal 360 being a high level and when the clock signal 360 is a low level, a flip-flop circuit holding the output signal 376 is employed.

When input signals 451 through 453 of the circuit block in FIG. 13 are supplied from a static logic circuit, it is not necessary to change flip-flop circuits 301 through 303. Just as in the case where the input signals 451 through 453 are supplied from a dynamic logic circuit, flip-flop circuits as in FIGS. 17 and 18 may be used. A supply from the dynamic logic circuit may be performed so that an input supply timing of input signals 451 through 453 satisfies a set up time and a hold time from a clock signal 360 just as for input signals 354 through 356 as in FIG. 14.

Further, because the dynamic logic circuit of the present invention has a characteristic of a dynamic circuit and is available for a high speed operation, the usage of the dynamic logic circuit can be improved by preparing with an ASIC circuit.

With respect to the dynamic logic circuit of the present invention, a time taken for the precharge can be reduced without increasing a delay time between a low-to-high transition of an input signal in the dynamic logic circuit and a low-to-high transition of an output signal.

Further, based on the dynamic logic circuit of the present invention, a through current can be reduced without increasing a delay time between a low-to-high transition of an input signal in the dynamic logic circuit and a low-to-high transition of an output signal.

While the present invention has been described above in conjunction with the preferred embodiments, one of ordinary skill in the art would be enabled by this disclosure to make various modifications to these embodiments and still be within the scope and spirit of the present invention as recited in the appended claims.

What is claimed is:

1. A semiconductor integrated circuit device, comprising:
   a plurality of logic circuits, each of them including a clock signal, a plurality of input signals and an output signal, wherein when said clock signal is a first level (a low level or a high level), said output signal becomes a second level (a low level or a high level), when said clock signal is reverse level of said first level (a low level or a high level), said output signal becomes a desired level (a low level or a high level) determined by said plurality of input signals, wherein each of said logic circuits includes:
   means for regulating at least one of said plurality of input signals forcibly to be at the second level at the time said clock signal is at said first level.

2. The semiconductor integrated circuit device according to claim 1, wherein said second level is a low level and said means for regulating has a circuit including a transistor element positioned between said at least one of said plurality of input signals and the power supply on a lower voltage potential side.

3. The semiconductor integrated circuit device according to claim 2, wherein said second level is a low level and said means for regulating has a circuit including a transistor element positioned between said at least one of said plurality of input signals and the power supply on a lower voltage potential side.

4. The semiconductor integrated circuit device according to claim 2, wherein said transistor element is an N-channel type MOS transistor.

5. A semiconductor integrated circuit having a clock signal, a plurality of input signals and at least one output signal, wherein when said clock signal is a first level (a low level or a high level), said at least one output signal becomes a second level (a low level or a high level), and when said clock signal is a reverse level of said first level (a high level or a low level), said at least one output signal becomes a desired level (a low level or a high level) determined by said plurality of input signals, comprising:
   a first dynamic logic circuit;
   at least one more dynamic logic circuit, thereby forming a semiconductor integrated circuit having a plurality of dynamic logic circuits;
   means for regulating at least one of said plurality of input signals forcibly to be said second level, wherein each of said dynamic logic circuits has said means for regulating, wherein an input capacity for each input terminal of said plurality of dynamic logic circuits is designed for including a capacity of said means for regulating at least one of a plurality of input signals forcibly to be said second level.

6. A semiconductor integrated circuit device, comprising a plurality of dynamic logic circuits, each of them having a clock signal, a plurality of input signals and at least one output signal, wherein when said clock signal is a first level (a low level or a high level), said at least one output signal becomes a second level (a low level or a high level), and when said clock signal is a reverse level of said first level (a high level or a low level), said at least one output signal becomes a desired level (a low level or a high level) determined by said plurality of input signals, wherein each of said dynamic logic circuits has means for regulating at least one of said plurality of input signals forcibly to be said second level, and each of said means for regulating is placed adjacent to a circuit on a side of receiving said at least one of said plurality of input signals rather than a circuit on a side of outputting said signal.

7. In a semiconductor circuit device including: a first MOS transistor of a first conductive type whose source electrode is connected with a first power supply and whose gate electrode is connected with a clock signal and whose drain electrode is used to send out an output signal; and a second MOS transistor of a second conductive type, different from said first conductive type, whose source electrode is connected with a second power supply, whose gate electrode is connected with a first input signal and whose drain electrode is connected with a drain electrode of said first MOS transistor directly or via other MOS transistors, the semiconductor circuit device, comprising:

a third MOS transistor connected between a gate electrode of said second MOS transistor and said second power supply.

8. The semiconductor circuit device according to claim 7, wherein a gate electrode of said third MOS transistor receives a signal for conducting said third MOS transistor when said first MOS transistor is conducting.

9. The semiconductor circuit device according to claim 8, wherein said third MOS transistor is said second conductive type and a gate electrode of said third MOS transistor receives a signal which is an inverted version of said clock signal.

10. The semiconductor circuit device according to claim 7, wherein said third MOS transistor is said second conductive type and a gate electrode of said third MOS transistor receives a signal that is an inverted version of said clock signal.

11. The semiconductor circuit device according to claim 7, wherein a drain electrode of said first MOS transistor and a drain electrode of said second MOS transistor are connected via at least one MOS transistor including a fourth MOS transistor of said second conductive type, whose gate electrode is connected with a second input signal.

12. The semiconductor circuit device according to claim 7, wherein there is provided a fifth MOS transistor of said second conductive type whose source electrode is connected with a second power supply, whose gate electrode is connected with a third input signal and whose drain electrode is connected with a drain electrode of said first MOS transistor directly or via other MOS transistors, and there is also provided a sixth MOS transistor whose source electrode is connected with said second power supply, whose drain electrode is connected with a gate electrode of said fifth MOS transistor and whose gate electrode is connected with a signal that is the same as that received by the gate electrode of said third MOS transistor.

13. The semiconductor circuit device according to claim 7, wherein there is provided a seventh MOS transistor of said first conductive type whose source electrode is connected with said first power supply, whose gate electrode is connected with a drain electrode of said first MOS transistor, and there is also provided an eighth MOS transistor of said second conductive type whose source electrode is connected with said second power supply, whose gate electrode is connected with a drain electrode of said first MOS transistor and whose drain electrode is connected with a drain electrode of said seventh MOS transistor, and an output signal is taken from a connection point of a drain electrode of said seventh MOS transistor and said eighth MOS transistor.

14. The semiconductor circuit device according to claim 13, wherein there is provided an eleventh MOS transistor of said first conductive type whose source electrode and drain electrode are respectively connected with a source electrode and a drain electrode of said first MOS transistor and whose gate electrode is connected with a drain electrode of said seventh MOS transistor.

15. The semiconductor circuit device according to claim 7, wherein there is provided a ninth MOS transistor of said first conductive type whose source electrode is connected with said first power supply, whose gate electrode is connected with said clock signal, there is also provided a tenth MOS transistor of said second conductive type whose source electrode is connected with said second power supply, whose gate electrode is connected with said clock signal and whose drain electrode is connected with a drain electrode of said ninth MOS transistor and a connection point of a drain electrode of said ninth MOS transistor and a drain electrode of said tenth MOS transistor is connected with a gate electrode of said third MOS transistor.

16. The semiconductor circuit device according to claim 15, wherein there is provided an eleventh MOS transistor of said first conductive type whose source electrode and drain electrode are respectively connected with a source electrode and a drain electrode of said first MOS transistor and whose gate electrode is connected with a drain electrode of a seventh MOS transistor.

17. The semiconductor circuit device according to claim 7, wherein said first conductive type is a P-channel type and said second conductive type is an N-channel type.

18. A semiconductor integrated circuit device, comprising: a plurality of logic circuits wherein a clock signal is input, a plurality of input signals are input, at least one output signal is output, said at least one output signal is set to a second level when said clock signal is a first level and said at least one output signal is set to a level determined by said plurality of input signals when said clock signal is a reverse level of said first level, wherein the semiconductor integrated circuit device includes:

means for regulating at least one of said plurality of input signals forcibly to be said second level.

19. The semiconductor integrated circuit device according to claim 18, wherein there is provided a static logic circuit connected to said plurality of logic circuits via a flip-flop circuit.

* * * * *